(12) United States Patent
Chen et al.

(10) Patent No.: US 9,275,970 B1
(45) Date of Patent: Mar. 1, 2016

(54) WIRE BONDS FOR ELECTRONICS

(71) Applicant: Hamilton Sundstrand Corporation, Charlotte, NC (US)

(72) Inventors: Yan Chen, South Windsor, CT (US); Sergei F. Burlatsky, West Hartford, CT (US); Mikhail B. Gorbounov, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/459,011

(22) Filed: Aug. 13, 2014

(51) Int. Cl.
  *H01L 23/34* (2006.01)
  *H01L 23/00* (2006.01)

(52) U.S. Cl.
  CPC ......... *H01L 24/49* (2013.01); *H01L 2224/4905* (2013.01)

(58) Field of Classification Search
  CPC ........... H01L 2224/48091; H01L 2924/01079; H01L 24/49

USPC .................................................. 257/723, 784
  See application file for complete search history.

(56) References Cited

U.S. PATENT DOCUMENTS

| | | | | |
|---|---|---|---|---|
| 4,824,005 A | * | 4/1989 | Smith, Jr. .................... | 228/1.1 |
| 6,285,075 B1 | * | 9/2001 | Combs et al. ................ | 257/675 |
| 6,958,616 B1 | * | 10/2005 | Mahoney et al. ......... | 324/755.05 |
| 2002/0043986 A1 | * | 4/2002 | Tay et al. .................... | 324/763 |
| 2002/0117330 A1 | * | 8/2002 | Eldridge et al. ............. | 174/260 |

* cited by examiner

*Primary Examiner* — Jami M Valentine
(74) *Attorney, Agent, or Firm* — Locke Lord LLP; Scott D. Wofsy; Joshua L. Jones

(57) ABSTRACT

A circuit element includes a semiconductor chip and a wire for connecting between the semiconductor chip and an additional circuit element. A plurality of wire bond connections electrically connect the wire and the semiconductor chip. The plurality of wire bond connections can be disposed on a surface of the semiconductor chip and on a surface of the wire.

13 Claims, 2 Drawing Sheets

WIRE BONDS FOR ELECTRONICS

BACKGROUND OF THE INVENTION

1. Field of the Invention

The present disclosure relates to integrated circuits, and more particularly to wire bonds for integrated circuits, MEMS devices, and the like.

2. Description of Related Art

Wires in power electronics are used to conduct current to and from a device package. The package wires are attached to the electronic components inside the package by way of wire bonds. During operation power electronic modules are subject to temperature sway. Particularly at the wire bonds for semiconductor chips, significant temperature variation can be observed. Wire material, i.e., aluminum and copper, and semiconductor chips, i.e. silicon, have different thermal expansion coefficients. Under the elevated temperature, the wire bond is subject to shear load due to the thermal expansion mismatch. This can lead to wire bond failure. The intensity of thermal mismatch is directly related to three key factors: the temperature sway amplitude, the bond dimension, and the difference in the coefficients of thermal expansion (CTE). Each of these key factors can compromise the reliability of the wire bond. Most work focus on the reduction of the thermal temperature sway by meanings as improvement of the bonding technology to reduce the contact electrical resistance, or use large bond to reduce the current density.

Various approaches have been developed to improve wire bond reliability. The mostly widely used concept is known as double stitch bonding. Instead of one stitch per wire, each wire is stitched multiple times onto a semiconductor chip. Another approach is using a flat ribbon wire instead of a round ribbon wire. The flat ribbon wire can achieve a relatively narrow bond with a bigger contact area. However, the bond dimension of either of these approaches is not reduced.

Such conventional methods and systems have generally been considered satisfactory for their intended purpose. However, there is still a need in the art for improved wire bonds. The present disclosure provides a solution for this need by using a plurality of wire bonds with smaller dimensions.

SUMMARY OF THE INVENTION

A circuit element includes a semiconductor chip and a wire for connecting between the semiconductor chip and an additional circuit element. A plurality of wire bond connections electrically connects the wire and the semiconductor chip. The plurality of wire bond connections can be disposed on a surface of the semiconductor chip and on a surface of the wire.

A helical shaped wire can be used to electrically connect the semiconductor chip, wherein the plurality of wire bond connections includes a plurality of wire bond connections on the surface of the chip and a plurality of wire bond connections on the wire. The helical pitch length of the helical shaped wire can be greater than the wire diameter of the helical shaped wire bond for spacing the wire bond connections. The essence of the helical wire shape design is to reduce the bond dimension. As the result of the wire curvature from its helical shape, the wire bond can be made more symmetric in dimensions than the bond made from the conventional straight wire.

The plurality of wire bond connections includes a plurality of individual wire bonds, each with a wire bond connection on the wire and a wire bond connection on the semiconductor chip. The plurality of individual wire bond connections can be spaced out along a length of the wire. The wire bond connections can extend outward from opposite side of the wire to the semiconductor chip. In certain embodiments, the wire bond connections can connect to a common point on the wire and radiate outward to wire bond connections on the semiconductor chip.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 2:
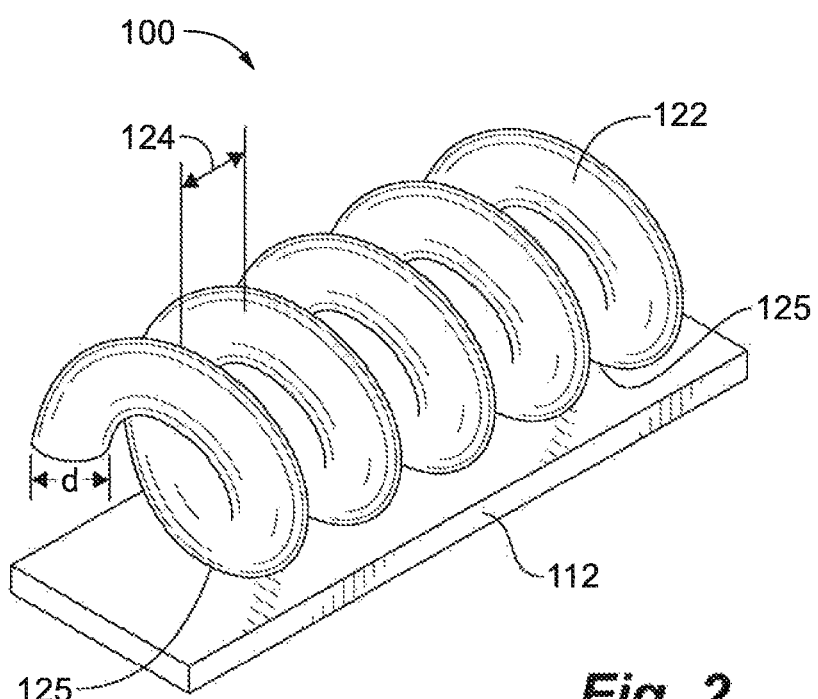
FIG. 2 is a perspective view of an exemplary embodiment of a wire bond constructed in accordance with the present disclosure showing a plurality of wire bond connections.

Reference will now be made to the drawings wherein like reference numerals identify similar structural features or aspects of the subject disclosure. For purposes of explanation and illustration, and not limitation, a partial view of an exemplary embodiment of a wire bond design in accordance with the disclosure is shown in FIG. 2 and is designated generally by reference character 100. Other embodiments of the wire bond design in accordance with the disclosure, or aspects thereof, are provided in FIGS. 3-4, as will be described.

Figure 1:
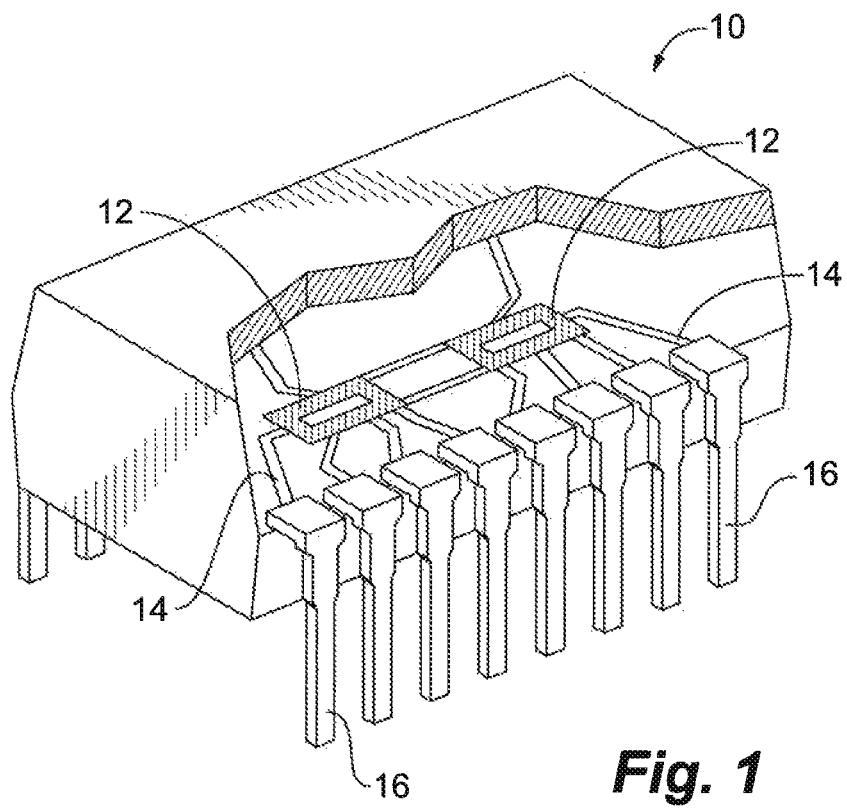
FIG. 1 is a perspective view of an exemplary integrated circuit, showing a plurality of wires electrically connecting a plurality of semiconductor chips.

The market for modern power electronics requires electrical components and connections therebetween to withstand high temperature ranges while maintaining high reliability. One of the barriers to meet these requirements is wire bond failure, which is one of the major failure modes of power electronic modules. Innovative wire bond design is the key factor to improve reliability. With reference to FIG. 1, a simplified embodiment of an integrated circuit 10 as known in the prior art is shown as a perspective cutaway view. The circuit 10 includes at least one semiconductor chip 12 electrically connected to a plurality of package wires 14. The wires 14 connect the semiconductor chips 12 and pins 16. Pins 16 provide power to and from to the semiconductor chips 12, e.g., by connecting pin 16 to a printed circuit board (PCB). Each of the wires 14 is bonded to the respective semiconductor chip 12. Typically in the prior art, the wire bonds are relatively large and asymmetric in dimension, e.g., for a 450 µm diameter wire, the wire bonds about 250 µm by 700 µm. The thermal mismatch is driven by the maximum dimension of the wire bonds, which is 700 mm using the above example.

To mitigate thermal mismatch, the present disclosure provides a solution to reducing bond dimension through wire bond designs without changing the overall bond area. FIG. 2 illustrates an exemplary embodiment of the present disclosure showing a circuit element 100 having a semiconductor chip 112 and a wire 122 providing electrical connection between the semiconductor chip 112 and an additional circuit element, for example, a pin for connecting to a PCB. A portion of the wire 122 which connects to chip 112, is manufactured into a helical shape. A plurality of wire bond connections 125 between the wire 122 and the semiconductor chip 112 are provided along the helical-shaped portion of the wire 122. For example, instead of a 450 µm wire, the helical shaped wire 122 has a diameter of approximately 300 µm. Further, a pitch 124 of the helical shaped wire bond 122 is greater than a diameter d. In this manner, multiple separated wire bond connections 125 are formed with dimensions about 150 µm by 150 µm. At least seven wire bond connections provide a total bond area similar to total bond area of conventional circuit element. Even though the total bond area is similar to conventional methods using a relatively thicker wire, the reduction of wire bond dimension from 700 µm to 150 µm mitigates the thermal mismatch between the semiconductor chip and the wire. Therefore, the life of the wire bond can be enhanced as well as the reliability of the circuit elements.

Figure 3:
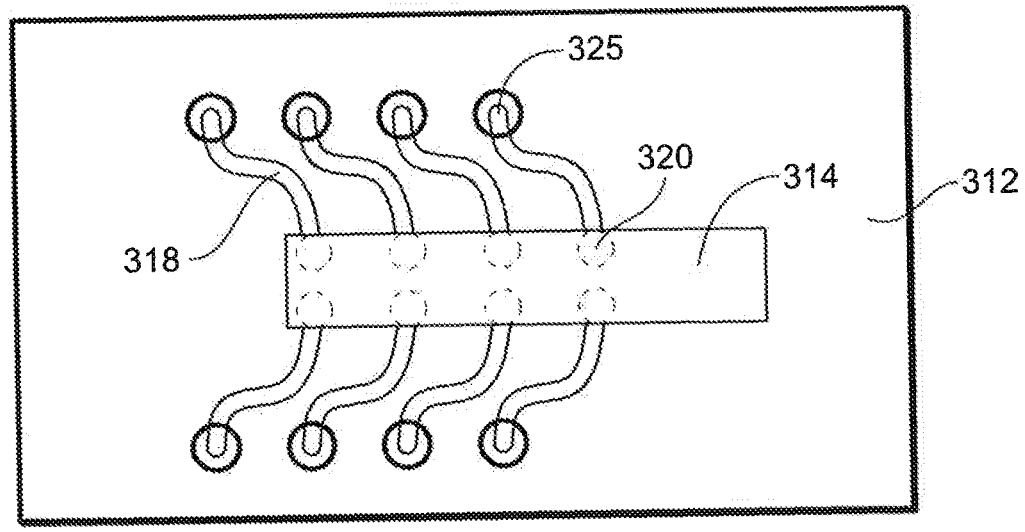
FIG. 3 is a top plan view of another exemplary embodiment of a wire bond constructed in accordance with the present disclosure.
Figure 4:
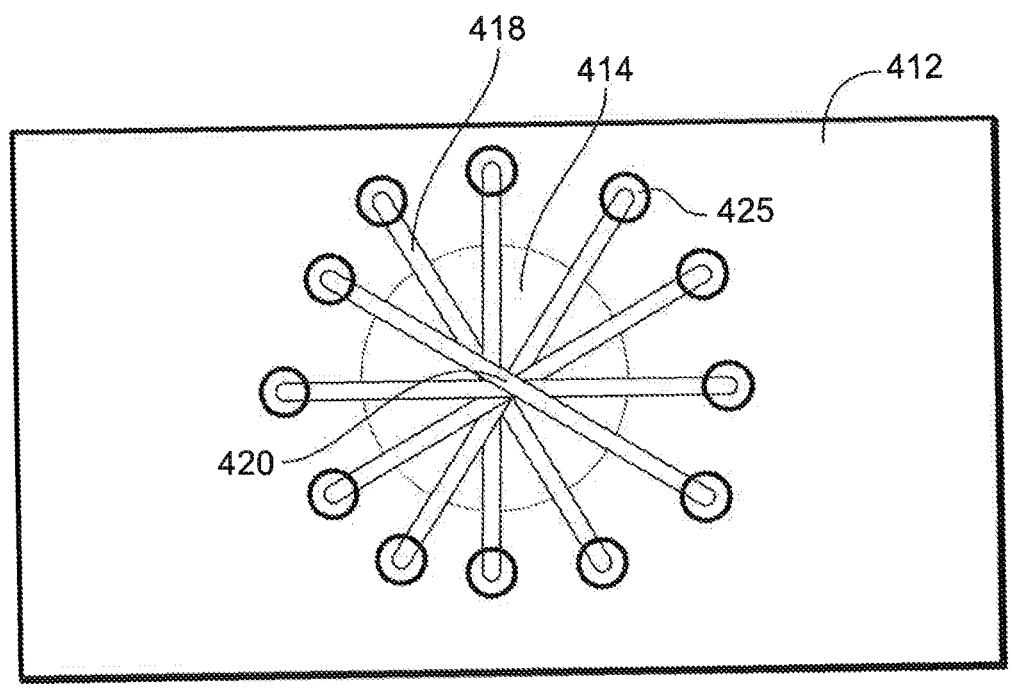
FIG. 4 is a top plan view of another exemplary embodiment of a wire bond constructed in accordance with the present disclosure

With reference to FIGS. 3 and 4, additional exemplary embodiments of wire bond designs which provide a plurality of wire bond connections are shown. The plurality of wire bond connections include a plurality of individual wire bonds, each with a wire bond connection on the wire and a wire bond connection on the semiconductor chip. In the embodiment shown in FIG. 3, the plurality of wire bond connections 320 can be spaced out along a length of the wire 314 and extend outward from opposite sides of the wire 314 thereby providing a plurality of wire bond connections 325 thereon. A plurality of relatively thin wires 318 comprise the wire bond and are coupled to wire 314 via bonding or mechanical clamping. The opposing ends of the thin wires 318 are bonded to the semiconductor chip 312 via friction welding. Similarly, in the embodiment shown in FIG. 4, a plurality of thin wires 418 can connect to a common point 420 on a surface of wire 414 and radiate outwardly onto a surface of the semiconductor chip 412 thereby providing wire bond connections 425 in a circumferential pattern on the semiconductor chip 412. Those skilled in the art will readily appreciate that while described herein with specific examples, any other suitable wire bond arrangement and number of wire bond connections can be used without departing from the scope of this disclosure.

The methods and systems of the present disclosure, as described above and shown in the drawings, provide for a wire bond design with superior properties including improving the reliability and longevity of the wire bond, by reducing thermal mismatch through smaller wire bonds. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A circuit element, comprising:
    a semiconductor chip;
    a wire for connecting between the semiconductor chip and an additional circuit element; and
    a plurality of wire bond connections electrically connecting the wire and the semiconductor chip,
    wherein the wire is a helical shaped wire that electrically connects to the semiconductor chip through the plurality of wire bond connections.

2. The circuit element of claim 1, wherein the plurality of wire bond connections are disposed on a surface of the semiconductor chip.

3. The circuit element of claim 1, wherein the plurality of wire bond connections are disposed on a surface of the wire.

4. The circuit element of claim 1, wherein a pitch length of the helical shaped wire is greater than a wire diameter of the helical shaped wire bond.

5. The circuit element of claim 1, wherein the helical shaped wire bond is 150 µm in thickness.

6. The circuit element of claim 1, wherein the plurality of wire bond connections includes a plurality of individual wire bonds, each with a wire bond connection on the wire and a wire bond connection on the semiconductor chip.

7. The circuit element of claim 6, wherein the plurality of individual wire bonds are spaced out along a length of the wire and extend outwardly from opposite sides of the wire to the semiconductor chip.

8. The circuit element of claim 6, wherein the plurality of individual wire bonds can connect to a common point on the wire and radiate outward to the wire bond connections on the semiconductor chip.

9. The circuit element of claim 1, wherein at least seven wire bond connections are disposed on a surface of the semiconductor chip.

10. An integrated circuit comprising:
    an integrated circuit package;
    a plurality of circuit elements disposed on a substrate within the integrated circuit package;
    a plurality of pins electrically connecting to the plurality of circuit elements;
    a plurality of wires connecting between the plurality of circuit elements and to the plurality of pins; and
    a plurality of wire bond connections electrically connecting one wire with one circuit element,
    wherein the wires are helical shaped wires that electrically connect to the circuit element through the plurality of wire bond connections.

11. The integrated circuit of claim 10, wherein the plurality of wire bond connections are disposed on a surface of the circuit element.

12. The integrated circuit of claim 10, wherein the plurality of wire bond connections are disposed on a surface of the wire.

13. The integrated circuit of claim 10, wherein a pitch of the helical shaped wire is greater than a thickness of the helical shaped wire bond.

* * * * *